United States Patent [19]

Barth

[11] Patent Number: 5,511,651
[45] Date of Patent: Apr. 30, 1996

[54] ARRANGEMENT FOR THE TRANSPORT OF PRINTED CIRCUIT BOARDS

[75] Inventor: Klaus Barth, Neukirchen-Vluyn, Germany

[73] Assignee: U.S. Philips Corporation, New York, N.Y.

[21] Appl. No.: 333,569

[22] Filed: Nov. 2, 1994

[30] Foreign Application Priority Data

Nov. 5, 1993 [DE] Germany .......................... 43 37 811.0

[51] Int. Cl.[6] .................................................. B65G 15/10
[52] U.S. Cl. ..................... 198/817; 198/470.1; 198/626.1
[58] Field of Search .............................. 198/347.2, 470.1, 198/620, 626.1, 803.3, 803.7, 812, 817

[56] References Cited

U.S. PATENT DOCUMENTS

| | | | |
|---|---|---|---|
| 2,932,376 | 4/1960 | Millington | 198/812 X |
| 4,989,718 | 2/1991 | Steeber | 198/347.3 |
| 5,009,303 | 4/1991 | Lutzke | 198/347.3 |
| 5,145,055 | 9/1992 | Kondo | 198/817 X |
| 5,368,643 | 11/1994 | Kuster | 198/817 X |

FOREIGN PATENT DOCUMENTS 3116889  5/1991  Japan .

*Primary Examiner*—James R. Bidwell
*Attorney, Agent, or Firm*—Ernestine C. Bartlett

[57] ABSTRACT

The invention relates to an arrangement for the transport of circuit boards (7), such as printed circuit boards or substrates, along a transport path between and/or in the various work stations during assembly, the circuit boards being manipulated in a well-defined position, which arrangement comprises a conveyor chain (3) carrying holding devices (3d) for individual circuit boards (7), which holding devices are spaced apart at distances equal to a plurality of chain links (3c), and transport strip portions (7b) of board material provided on and separable from the circuit boards (7), which strip portions have no circuit function and can be held by the holding devices (3d) for transport by way of the moving conveyor chain (3).

11 Claims, 4 Drawing Sheets

ARRANGEMENT FOR THE TRANSPORT OF PRINTED CIRCUIT BOARDS

FIELD OF THE INVENTION

The invention relates to an arrangement for the transport of circuit boards, such as printed circuit boards or substrates, along a transport path between and/or in the various work stations during assembly, the circuit boards being manipulated in a well-defined position.

BACKGROUND OF THE INVENTION

For the transport of printed circuit boards it is known to place these on a carrier and to convey the carrier with the printed circuit board from work station to work station by means of a conveyor belt. For a more efficient use of the carrier a plurality of printed circuit boards are combined to a panel, the individual printed circuit boards being subsequently cut out of this panel.

The use of panels is not flexible enough. If the outer dimensions of one of the p.c. boards should be varied the entire panel will become useless because only this panel fits on the carrier.

SUMMARY OF THE INVENTION

An object of the invention is to provide a more versatile arrangement for the transport of printed circuit boards, which enables the printed circuit boards to be changed rapidly.

According to the invention this object is achieved with an arrangement of the type defined in the opening paragraph in that a conveyor chain carrying holding devices for individual circuit boards, which holding devices are spaced apart at distances equal to a plurality of chain links, transport strip portions of board material provided on and separable from the circuit boards, which strip portions have no circuit function and can be held by the holding devices for transport by means of the moving conveyor chain.

When the conveyor chain has fixtures which can hold separate circuit boards the outer dimensions of the circuit boards will be variable within broad limits. Special carriers with associated panels having fixed outer dimensions are then no longer required.

In a further embodiment of the invention the holding device is a clamping device into which the transport strip portion of a circuit board is clamped at one side for transport by means of the chain and from which it can be removed for further processing at another location. Such a clamping is simple but is wholly adequate for the purpose of transport.

In a further embodiment of the invention the holding device comprises a carrier with projecting pins, onto which the circuit board can be placed with holes corresponding to the pins for transport in a horizontal position. This enables a plurality of circuit boards to be juxtaposed on the supports, for example when a reflow furnace has a wider passage which is to be utilized.

In a further embodiment of the invention the carriers are held by mutually parallel conveyor chains.

In a further embodiment of the invention the transport path of the conveyor chain between two successive work stations includes a buffer device at whose location the transport path is changed so as to adapt the length of the transport path to the desired transport time. The chain transport of individual circuit boards enables the flexibility of the transport arrangement to be improved.

The buffer device of the arrangement may then be constructed in such a manner that in a transport arrangement, by means of which the conveyor chain is moved along a rectilinear transport path between the work stations as a chain loop having a forward section and a return section, a compensation device has been provided, which compensation device comprises a compensation member which is movable transversely of the transport path and has guide wheels at its ends, which guide wheels guide the conveyor chain, which is deflected in the longitudinal direction of the compensation member at both sides of said compensation member. The compensation member enables discontinuities in the production to be compensated for in that the circuit boards carried by the conveyor chain run onto the compensation member to a larger or smaller extent.

In a further embodiment of the invention the conveyor chain, which is guided as a loop over chain drive wheels at the respective transitions from the forward section to the return section and vice versa, is driven by means of independent drives which act on the chain drive wheels at the beginning and at the end of the transport path. By means of the drives the transport of the circuit boards can be adapted to the conditions occurring in the event of production discontinuities in the individual work stations. If a work station does not supply any circuit boards the relevant drive stops and the other drive ensures that any circuit boards still present on the conveyor chain are transferred to the next work station. In the event of an acceptance failure at the next station the drive at the side of this station stops and the drive at the side of the preceding station will load the conveyor chain despite the acceptance failure at the receiving side. Such a compensation is useful and effective.

In a further embodiment of the invention there is provided a buffer device in which a robot can temporarily store circuit boards, the buffer device comprising clamping strips arranged in layers above one another.

BRIEF DESCRIPTION OF THE DRAWINGS

The invention will now be described in more detail with reference to the drawings.

DETAILED DESCRIPTION OF THE PREFERRED EMBODIMENTS

Figure 1:
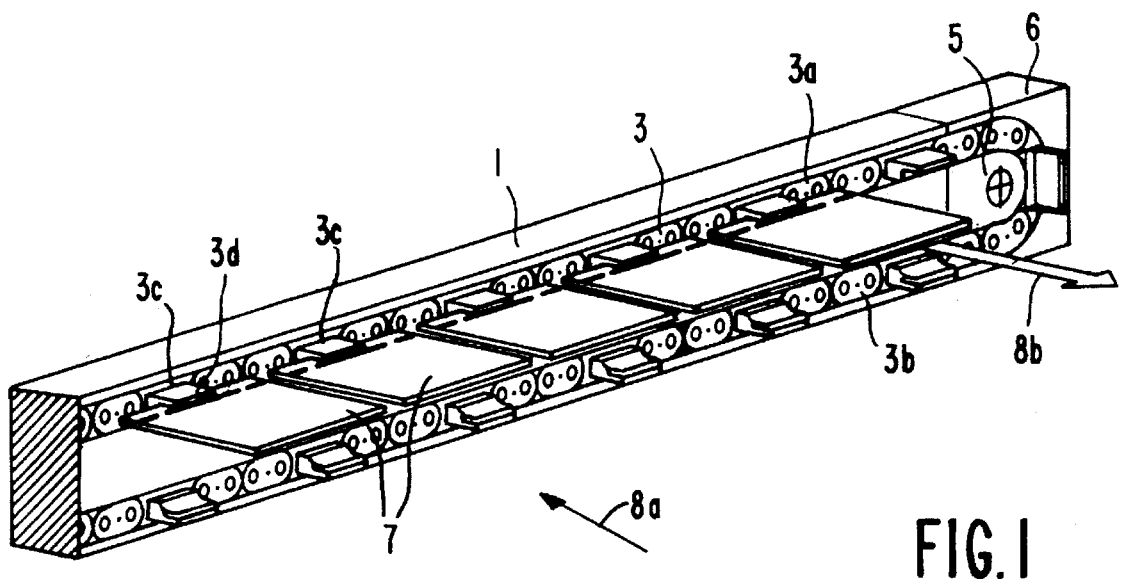
FIG. 1 shows a part of an arrangement for the transport of separate circuit boards by means of a conveyor chain which is guided in an endless loop and which carries separate circuit boards.

FIG. 1 shows a transport arrangement 1 in which a conveyor chain 3 having an upper section 3a and a lower section 3b runs in an endless loop. The conveyor chain 3 is guided over drive wheels 5 at the end 6 of the transport arrangement 1. In the Figure this is shown for the right-hand part, the left-hand part of the arrangement 1, which part is cut away and not shown, being similar to the right-hand part.

Figure 5:
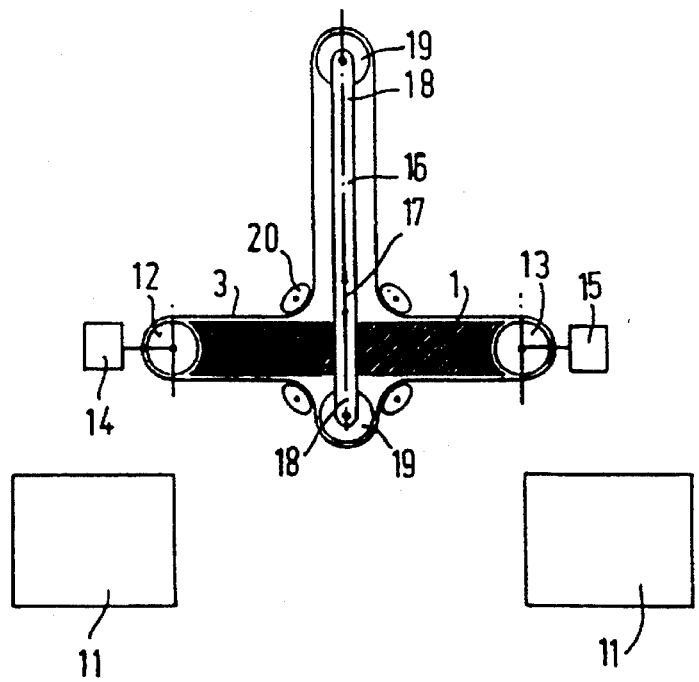
FIG. 5 shows a buffer station in a conveyor chain loop with a transversely movable compensation member.

The transport arrangement 1 with the conveyor chain 3 is arranged between work stations 11, which are shown diagrammatically in FIG. 5. Transfer robots 23 (shown in FIG. 8) are disposed near the work stations 11 to clamp the circuit boards 7 from a preceding work station onto the conveyor chain (indicated by means of an arrow 8a in FIG. 1). Another robot 23 is disposed at the other end 6 of the transport arrangement 1 to remove the circuit boards 7 from the conveyor chain and convey them to the next work station (indicated by an arrow 8b in FIG. 1).

As is shown in FIG. 1, the individual chain links 3c carry clamping devices 3d for the circuit boards 7. As is shown to an enlarged scale in FIG. 2, each clamping device comprises a locating plate 3e with a stop 3f and a pressure spring 3g. The circuit boards 7 are clamped between the locating plate 3e at the upper side and the pressure spring 3g at the lower side.

Figure 3:
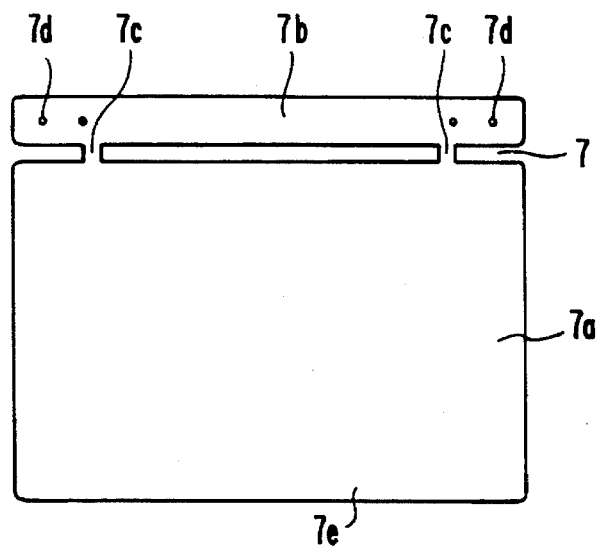
FIG. 3 shows a circuit board intended for use with the transport arrangement and comprising a strip portion which serves for clamping.

FIG. 3 shows the construction of the circuit boards 7. The boards comprise a p.c. board portion 7a and a clamping strip portion 7b. The strip portion 7b is introduced into the clamping device 3d. The strip portion 7b is only connected to the p.c. board portion 7a by bridges 7c.

For the normal transport of circuit boards from one work station 11 to the next the chain conveyor arrangement 1 shown in FIG. 1 is used in a linear configuration. However, in special cases a simultaneous movement of a plurality of juxtaposed circuit boards 7 may be required, for example for soldering in a reflux furnace after they have been provided with components, to melt the applied solder and thereby form soldered joints at the locations where solder has been applied.

Figure 4:
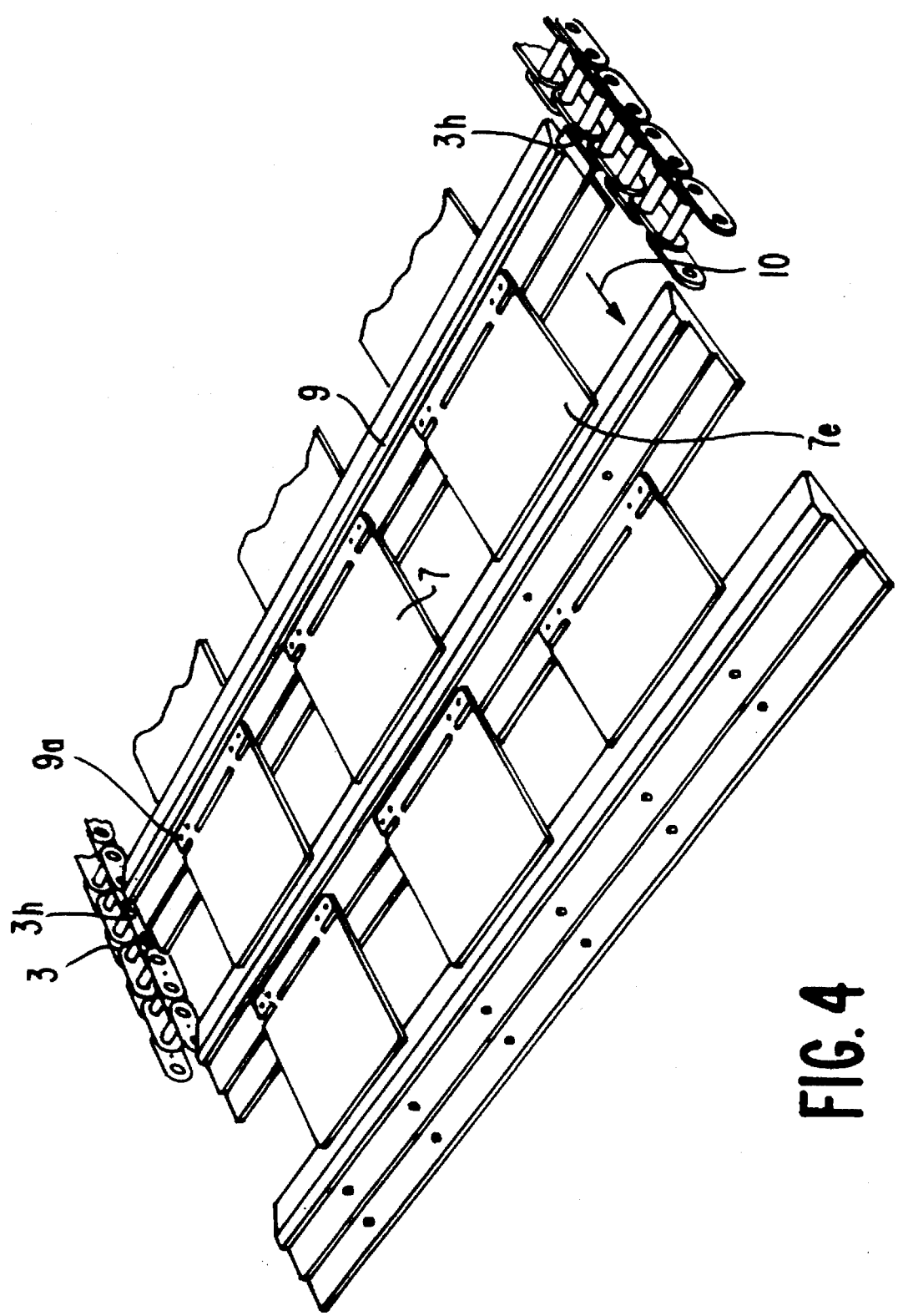
FIG. 4 shows a modification of the transport arrangement with two parallel transport chains and supporting strips for the transport in the drying furnace and reflow furnace.

In such a case the transport arrangement comprises two parallel chain loops 3, as is shown in FIG. 4. Chain links 3h between these chain loops 3 hold carrying strips 9. These carrying strips 9 have upwardly projecting pins 9a. In their strip portions 7b the circuit boards 7 have holes 7d corresponding to the pins 9a. Moreover, the carrying strips 9 are spaced at such a distance from one another in the transport direction indicated by the arrow 10, that the circuit board edge 7e which is remote from strip portion 7b can be supported by the adjacent carrying strip 9. A robot, not shown, places a plurality of circuit boards 7 side by side onto the pins 9a, the boards thus being locked against displacement and being supported at the strip portions 7b and the edges 7e. In this way a plurality of juxtaposed circuit boards 7 can be conveyed to a work station.

Obviously, the supports can also be provided for single circuit boards 7. However, this will be effective only in special cases because this is more expensive than in the case of the clamping devices 3d.

Figure 6:
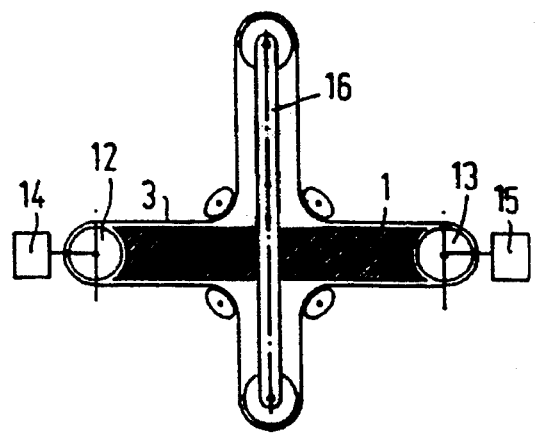
FIGS. 6 and 7 show the compensation member which projects upwardly over a smaller height than in FIG. 5, the buffer capacity between the work stations decreasing from FIG. 5 to FIG. 6 to FIG. 7.
Figure 7:
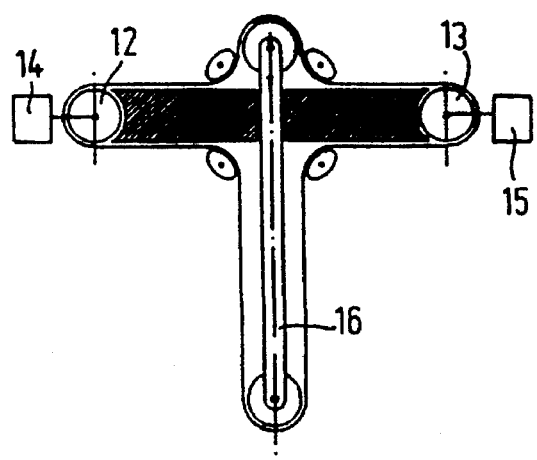

The flexibility of the conveyor chains 3 used for the transport of individual circuit boards makes it possible to employ a buffer device. FIGS. 5, 6 and 7 show such a buffer device. Again the transport arrangement 1 comprises the conveyor chain 3 forming an endless loop. At the location of the work stations 11, shown as boxes in FIG. 5, the transport arrangement 1 comprises drive wheels 12 and 13, which can be driven by means of diagrammatically shown drive motors 14, 15 and stopped independently of one another. A vertical compensation 16 extends transversely of the transport arrangement 1 and can be moved up and down in the directions indicated by a double arrow 17 in accordance with the driving movements imparted by the motors 14 and 15. The compensation member 16 has guide wheels 19 at its ends 18. Between the drive wheels 12 and 13 compensation wheels 20 deflect the conveyor chain 3 in a direction parallel to the compensation member 16, the chain being guided by the guide wheels 19 at the ends 18.

In the same way as shown in FIG. 1 clamping devices 3d can also move the circuit boards 7 on the chain 3 into the area of the compensation member 16 by means of the chain. This provides a buffer action. It is assumed that the drive motor 14 rotates the drive wheel 15 and a robot 23 loads circuit boards 7 onto the running conveyor chain 3. If in response to a disturbance at the right-hand work station 11 the drive wheel 13 is stopped by stopping the motor 15 the compensation member 16 is moved upward and the circuit boards 7 will not travel directly to the right-hand work station 11 but will first move upward with the upwardly moving compensation member 16. FIG. 5 shows the compensation member in its fully slid-up position.

FIG. 6 shows what happens when the drive motor 5 is re-started. When the speed of the motors 14 and 15 is the same the compensation member remains in the upward position and the circuit boards continue to move to the right-hand work station via the slid-up compensation member. FIG. 6 illustrates what happens when a disturbance occurs at the previous left-hand work station 11. The motor 14 then stops and the drive wheel 12 retains the conveyor chain 3 in the left-hand part of the transport arrangement 1. However, now chain is pulled forward by the drive motor 15 via the drive wheel 13. The compensation member 16 is lowered and the robot 23 can remove the circuit boards 8 on the chain in the direction indicated by the arrow 8b. Lowering proceeds until, as is shown in FIG. 7, the compensation member 16 has reached its lowermost position. If the disturbance at the preceding left-hand work station persists the transport arrangement 1 should be stopped.

Figure 2:
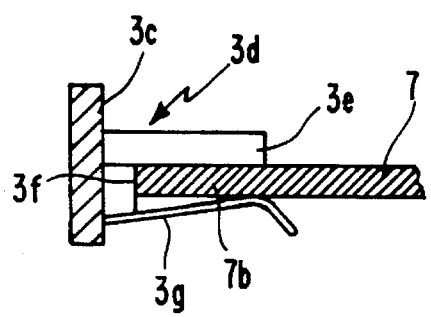
FIG. 2 shows a clamping device for clamping the circuit boards onto the conveyor chain.
Figure 8:
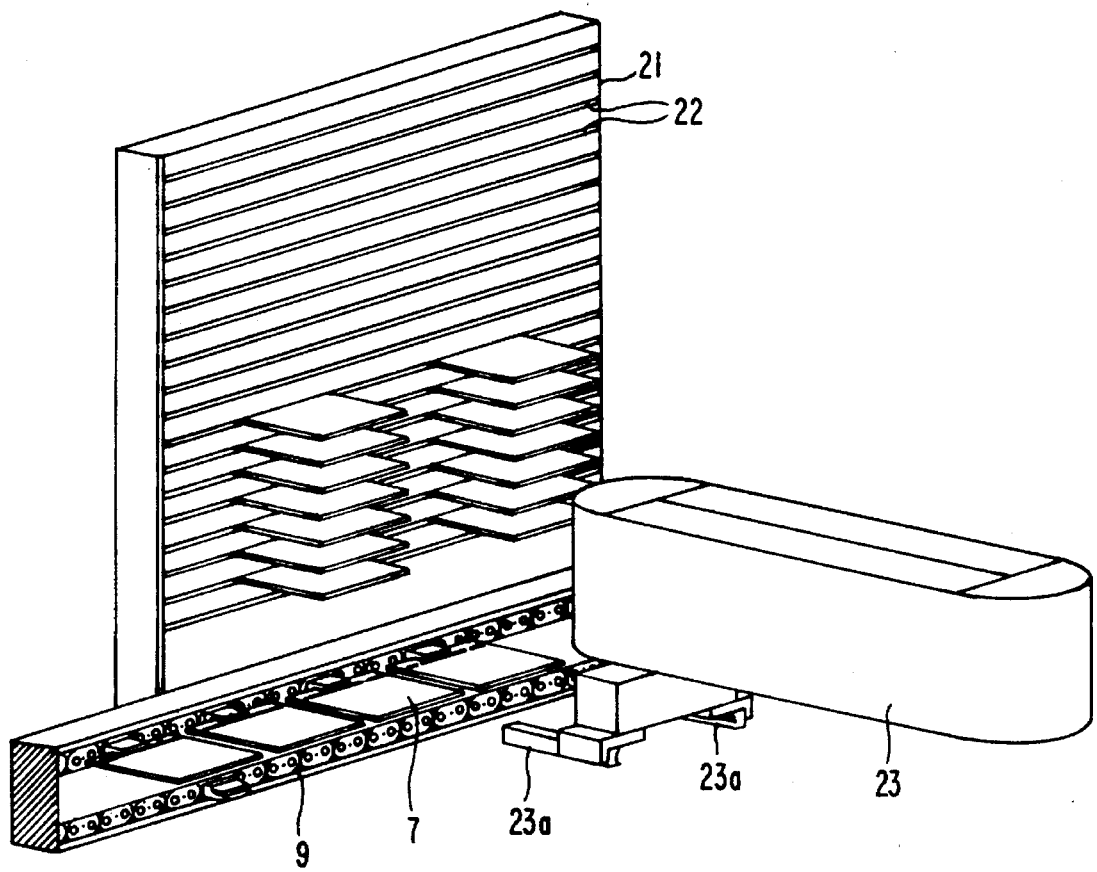
FIG. 8 shows another type of buffer station with clamping means and a part of a robot capable of handling the circuit boards.

FIG. 8 shows a further embodiment of a buffer station. This buffer station comprises a frame 21 with parallel clamping strips 22 arranged above one another. In the event of production discontinuities a robot 23 can remove circuit boards 7 from the conveyor chain with its gripper 23a and insert them between the clamping strips 22, as shown in FIG. 2. When the production discontinuity has ceased or if the temporary storage is to be ended for another reason the robot will place the circuit boards back onto the transport arrangement 1.

I claim:

1. An arrangement for the transport of circuit boards (7), along a transport path between and/or in various work stations during assembly, the circuit boards being manipulated in a predetermined position, which arrangement comprises a conveyor chain (3) carrying holding devices (3d) for individual circuit boards (7), which holding devices are spaced apart at distances equal to a plurality of chain links (3c), and transport strip portions (7b) of board material provided on and separable from the circuit boards (7), which strip portions have no circuit function and can be held by the holding devices (3d) for transport by means of the moving conveyor chain (3).

2. An arrangement as claimed in claim 1, wherein the holding device (3d) is a clamping device (3e, 3g) into which the transport strip portion (7b) of a circuit board (7) is clamped at one side for transport by means of the chain (3)

and from which it can be removed for further processing at another location.

3. An arrangement as claimed in claim 1, wherein the holding device comprises a carrier (9) with projecting pins (9a), onto which the circuit board (7) can be placed with holes (7d) corresponding to the pins (9a) for transport in a horizontal position.

4. An arrangement as claimed in claim 3, wherein the carriers (9) are held by mutually parallel conveyor chains (3).

5. An arrangement as claimed in claim 1, wherein the transport path of the conveyor chain (3) between two successive work stations includes a buffer device at whose location the transport path is changed so as to adapt the length of the transport path to the desired transport time.

6. An arrangement as claimed in claim 5, wherein in a transport arrangement (1), by means of which the conveyor chain (3) is moved along a rectilinear transport path between the work stations (11) as a chain loop having a forward section and a return section (3a, 3b), a compensation device has been provided, which compensation device comprises a compensation member (16) which is movable transversely of the transport path and has guide wheels (19) at its ends (18), which guide wheels guide the conveyor chain (3), which is deflected in the longitudinal direction of the compensation member (16) at both sides of said compensation member.

7. An arrangement as claimed in claim 6, wherein the conveyor chain (3), which is guided as a loop over chain drive wheels (12, 13) at the respective transitions from the forward section to the return section and vice versa, is driven by means of independent drives (14, 15) which act on the chain drive wheels at the beginning and at the end of the transport path.

8. An arrangement as claimed claims 1, wherein there is provided a buffer device (21) in which a robot (23) can temporarily store circuit boards (7), the buffer device (21) comprising clamping strips (22) arranged in layers above one another.

9. An arrangement as claimed in claim 2 wherein there is provided a buffer device (21) in which a robot (23) can temporarily store circuit boards (7), the buffer device (21) comprising clamping strips (22) arranged in layers above one another.

10. An arrangement as claimed in claim 3 wherein there is provided a buffer device (21) in which a robot (23) can temporarily store circuit boards (7), the buffer device (21) comprising clamping strips (22) arranged in layers above one another.

11. An arrangement as claimed in claim 4 wherein there is provided a buffer device (21) in which a robot (23) can temporarily store circuit boards (7), the buffer device (21) comprising clamping strips (22) arranged in layers above one another.

* * * * *